United States Patent [19]
Popat et al.

[11] Patent Number: 6,025,114
[45] Date of Patent: Feb. 15, 2000

[54] LIQUID PHOTOCURABLE COMPOSITIONS

[75] Inventors: Ajay Haridas Popat, Warrington; John Robert Lawson, Manchester, both of United Kingdom

[73] Assignee: Zeneca Limited, London, United Kingdom

[21] Appl. No.: 08/913,466

[22] PCT Filed: Mar. 6, 1996

[86] PCT No.: PCT/GB96/00518

§ 371 Date: Sep. 11, 1997

§ 102(e) Date: Sep. 11, 1997

[87] PCT Pub. No.: WO96/28763

PCT Pub. Date: Sep. 19, 1996

[30] Foreign Application Priority Data

Mar. 11, 1995 [GB] United Kingdom ................... 9504995

[51] Int. Cl.[7] ............................ G03F 7/027; G03F 7/028; G03C 9/08
[52] U.S. Cl. ................ 430/284.1; 430/269; 522/96; 522/92; 264/401
[58] Field of Search ................. 430/284.1, 269; 522/96, 92; 264/401

[56] References Cited

U.S. PATENT DOCUMENTS

| | | | |
|---|---|---|---|
| 4,789,620 | 12/1988 | Sasaki et al. | 430/280.1 |
| 4,945,032 | 7/1990 | Murphy et al. | 430/394 |

FOREIGN PATENT DOCUMENTS

| | | | |
|---|---|---|---|
| 2007295 | 7/1990 | Canada | C08F 2/50 |
| 2079652 | 4/1993 | Canada | G03F 7/028 |
| 0 171 069 | 2/1986 | European Pat. Off. | G03C 9/08 |
| 0 425 440 A1 | 5/1991 | European Pat. Off. | G03F 7/031 |
| 0 425 441 A2 | 5/1991 | European Pat. Off. | G03F 7/027 |
| 425 441 | 5/1991 | European Pat. Off. | . |
| 0 506 616 A1 | 9/1992 | European Pat. Off. | G03F 7/027 |
| 0 525 578 A1 | 2/1993 | European Pat. Off. | G03F 7/027 |
| 0 554 215 A2 | 8/1993 | European Pat. Off. | C07C 69/54 |
| 554 215 | 8/1993 | European Pat. Off. | . |
| 0 562 826 A1 | 9/1993 | European Pat. Off. | G03F 7/027 |
| 0 565 403 A1 | 10/1993 | European Pat. Off. | C01B 33/145 |
| WO 89/08021 | 9/1989 | WIPO | B29D 11/00 |

OTHER PUBLICATIONS

Hunziker et al, 93–245154, English Abstract of EP554219, WPIDS File, Derwent Information LTD, 2 pages, 1998.
Bernard et al, 91–126891, English Abstract of EP 425441, WPIDS File, Derwent Information LTD, 2 pages, 1998.

Primary Examiner—Cynthia Hamilton
Attorney, Agent, or Firm—Pillsbury Madison & Sutro, LLP

[57] ABSTRACT

1. This invention relates to a liquid composition comprising:
   a) 2 to 20 parts of a monomeric poly(meth)acrylate having a functionality of at least 3 and a MW of at least 650;
   b) 20 to 60 parts of a urethane(meth)acrylate having a functionality of 2 to 4 and a MW of 400 to 10,000;
   c) 20 to 80 parts of a monomeric or oligomeric di(meth)acrylate based on bisphenol A or bisphenol F; and
   d) 0.1 to 10 parts of a photoinitiator;
wherein all parts are by weight and the total number of parts of a)+b)+c)+d) add up to 100.

The compositions are suitable for the stereolithographic production of three-dimensional articles such as models of mechanical and body parts and are particularly notable for their low curl & shrinkage coupled with fast rate of cure.

12 Claims, No Drawings

LIQUID PHOTOCURABLE COMPOSITIONS

This invention relates to photocurable compositions, to a process for their polymerisation by means of actinic radiation, to a process for the production of three-dimensional articles from the compositions and to articles so prepared.

It is known that complicated three-dimensional articles can be produced from liquid, photocurable compositions by means of stereolithography. One such process is described in Hull's U.S. Pat. No. 4,575,330. Articles are built up in layers, each new curable layer of resin being firmly attached to the preceding pre-cured layer by preliminary curing by means of UV/VIS light. The overall construction of the three-dimensional article is normally controlled by computer. Photocurable compositions (e.g. liquid resins and resin mixtures) and their use as coating agents, adhesives and photoresists are known. However, the majority of such compositions are not suitable for the production of solidified three-dimensional articles by stereolithography because some are too viscous, whilst others are insufficiently light-sensitive, cure slowly or suffer from excessive shrinking or curling when they are cured.

Ideally photocurable compositions for stereolithography cure reasonably quickly and have a small volume shrinkage in the transition from the liquid to solid state. The so-called "curl factor" is often quoted as a measure of shrinkage induced deformation and a curl factor of 30% is considered by many as being the maximum acceptable, depending or what the article is, and curl factors of below 20% are preferred.

Canadian Patent application 2028541 suggests photocurable compositions for stereolithography. Whilst these compositions do work they tend to have a high curl distortion and high viscosity.

According to the present invention there is provided a liquid composition comprising:

a) 2 to 20 parts of a monomeric poly(meth)acrylate having a functionality of at least 3 and a MW of at least 650;

b) 20 to 60 parts of a urethane(meth)acrylate having a functionality of 2 to 4 and a MW of 400 to 10,000;

c) 20 to 80 parts of a monomeric or oligomeric di(meth)acrylate based on bisphenol A or bisphenol F; and d) 0.1 to 10 parts of a photoinitiator;

wherein all parts are by weight and the total number of parts of a)+b)+c)+d) add up to 100.

The liquid composition of the invention preferably comprises or consists essentially of 5 to 18 parts, more preferably 8 to 16 parts of component a); 20 to 50 parts, more preferably 25 to 45 parts of component b); 20 to 70 parts, more preferably 30 to 60 parts, especially 35 to 55 parts, more especially 40 to 50 parts of component c); and 1 to 9 parts, more preferably 2 to 8 parts, especially 3 to 7 parts of component d); wherein all parts are by weight and the total number of parts of a)+b)+c)+d) add up to 100.

In a particularly preferred embodiment the liquid composition of the invention comprises or consists essentially of 8 to 16 parts of component a); 25 to 45 parts of component b); 40 to 50 parts of component c); and 3 to 7 parts of component d); wherein all parts are by weight and the total number of parts of a)+b)+c)+d) add up to 100.

Component a) preferably has a MW (i.e. molecular weight) greater than 800, more preferably in the range 880–1200, especially in the range 900–1100.

Examples of suitable compounds which may be used as component (a) are tri-, tetra- and penta-(meth)acrylates (including mixtures thereof), especially those of the formulae I, II, and III:

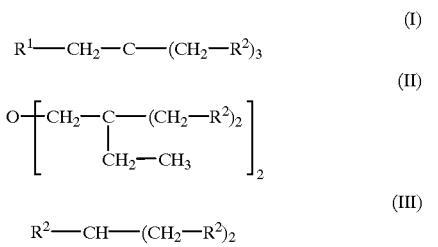

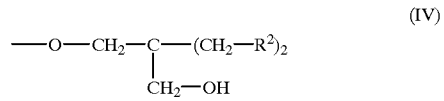

wherein $R^1$ is a hydrogen atom, methyl, hydroxyl or a group of the formula IV:

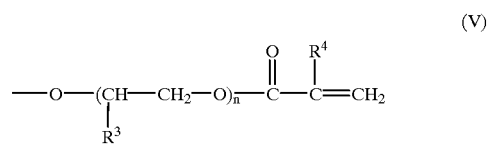

wherein $R^2$ is a group of the formula V:

$$—O—(\underset{\underset{R^3}{|}}{CH}—CH_2—O)_n—\overset{O}{\overset{||}{C}}—\underset{\underset{R^4}{|}}{C}=CH_2 \quad (V)$$

wherein n is from 3 to 8, preferably 4 to 8, and $R^3$ and $R^4$ are each independently hydrogen or methyl.

Compounds of the formulae I to III which are particularly preferred are those of the formula I in which $R^1$ is methyl or a group of the formula IV, $R^2$ is a group of the formula V wherein n is 4 or 5, and $R^3$ and $R^4$ are as hereinbefore defined.

As examples of compounds which can be used as component a) there may be mentioned highly propoxylated and ethoxylated 1,1,1-trimethylolpropane triacrylate or trimethacrylate and mixtures thereof. Compounds of this type are known and some are commercially available, for example SARTOMER products of Cray Valley Co. Limited, Newport, Wales and Sartomer Company supply such compounds under the product names SR-9021 and SR-9035.

One may use known urethane acrylates as component b) in compositions according to the invention and these can be prepared in a known manner, for example by reacting a hydroxyl-terminated polyurethane with acrylic acid or methacrylic acid to give the corresponding urethane(meth)acrylate, or by reacting an isocyanate-terminated prepolymer with hydroxyalkyl acrylates or methacrylates to give the urethane(meth)acrylate. Appropriate processes are disclosed in, for example, published European patent applications 114,982 and 133,908. The molecular weight of such acrylates is generally within the range from 400 to 10,000 preferably between 500 and 7,000.

Urethane (meth)acrylates are also available commercially under the trade marks NeoRad from Zeneca Resins, EBECRYL from UCB, Uvithane from Morton Thiokol and SR 9504, SR 9600, SR 9610, SR 9620, SR 9630, SR 9640 and SR 9650 from the Sartomer Company.

It is preferable to use urethane acrylates of MW 500–7000 derived from aliphatic starting materials.

Di(meth)acrylates based on bisphenol A and bisphenol F which can be used in or as component c) include bisphenol A diacrylates and dimethacrylates and bisphenol F diacrylates and dimethacrylates and the diacrylates or dimethacrylates of alkoxylated, preferably ethoxylated or propoxylated, bisphenol A or F. The acrylates obtainable by reaction of bisphenol A or bisphenol F diglycidyl ether with (meth) acrylic acid are also suitable, especially mixtures consisting of ethoxylated bisphenol A diacrylate and ethoxylated bisphenol A dimethacrylate. Monomeric or oligomeric di(meth)acrylates of this type are also known and some are available commercially, for example from the Sartomer Company under the product name SR-348 for ethoxylated bisphenol A dimethacrylate and under the product name SR-349 for ethoxylated bisphenol A diacrylate. It is preferable to use the di(meth)acrylates of bisphenol A or F and of ethoxylated bisphenol A or of ethoxylated bisphenol F and mixtures thereof as the component c).

Preferably component c) has a MW of 300–1000.

Any type of photoinitiator which forms free radicals when irradiated suitably can be employed as the component d) in the mixtures according to the invention. Suitable classes of known photoinitiators include benzoins; benzoin ethers, for example benzoin methyl ether, ethyl ether and isopropyl ether, benzoin phenyl ether and benzoin acetate; acetophenones, e.g. acetophenone, 2,2-dimethoxyacetophenone and 1,1-dichloroacetophenone; benzil; benzil ketals, e.g. benzil dimethyl ketal and benzil diethyl ketal; anthraquinones, e.g. 2-methylanthraquinone, 2-ethylanthraquinone, 2-tert-butylanthraquinone, 1-chloroanthraquinone and 2-amylanthraquinone; triphenylphosphine; benzoylphosphine oxides, e.g. 2,4,6-trimethylbenzoyldiphenylphospine oxide (Luzirin TPO); benzophenones, e.g. benzophenone and 4,4-bis-(N,N-dimethylamino)-benzophenone; thioxanthones and xanthones; acridine derivatives; phenazine derivatives; quinoxaline derivatives and 1-phenyl-1,2-propanedione-2-O-benzoyl oxime; 1-aminophenyl ketones and 1-hydroxyphenyl ketones, e.g. 1-hydroxycyclohexyl phenyl ketone, phenyl 1-hydroxyisopropyl ketone and 4-isopropylphenyl-1-hydroxyisopropyl ketone; all of which are known compounds.

Photoinitiators which are particularly suitable for use when the actinic radiation is from a Hg-Cd laser are acetophenones, e.g. 2,2-dialkoxybenzophenones, and α-hydroxyphenyl ketones, e.g. 1-hydroxycyclohexyl phenyl ketone and 2-hydroxyisopropyl phenyl ketone (=2-hydroxy-2,2-dimethylacetophenone).

A class of photoinitiators d) particularly suitable for argon ion lasers are benzil ketals, for example benzil dimethyl ketal, and especially an α-hydroxyphenyl ketone, benzil dimethyl ketal or 2,4,6-trimethylbenzoyldiphenylphosphine oxide.

Another class of suitable photoinitiators d) are the ionic dye-counter ion compounds which are capable of absorbing actinic radiation and producing free radicals which initiate polymerisation of the components. The mixtures according to the invention containing ionic dye-counter ion compounds can be cured in a fairly variable manner in this way with visible light having a wavelength of 400–700 nm. Ionic dye-counter ion compounds and their mode of action are known, for example from EP-A-0,223,587 and U.S. Pat. Nos. 4,751,102, 4,772,530 and 4,772,541. Examples of suitable ionic dye-counter ion compounds which may be mentioned are the anionic dye-iodonium ion complexes, the anionic dye-pyrylium ion complexes and especially, the cationic dye-borate anion compounds of the formula VI:

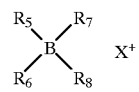

(VI)

wherein $X^+$ is a cationic dye and $R_5$, $R_6$, $R_7$ and $R_8$ are each independently alkyl, aryl, alkaryl, allyl, aralkyl, alkenyl or alkinyl group, an alicyclic group or a saturated or unsaturated heterocyclic group.

The photoinitiators are added in effective amounts, i.e. in amounts of about 0.1 to about 10 parts by weight, relative to the total amount of the components a) to d). If the mixtures according to the invention are used for stereolithographic processes in which laser radiation is used, it is preferred that the absorption capacity of the compositions is so adjusted by means of the type and concentration of the photoinitiator that the depth of curing at normal laser speed is approximately 0.1 to 2.5 mm.

Compositions according to the invention can contain a plurality of photoinitiators which have a different radiation sensitivity at different wavelengths. This achieves, for example, better utilisation of a UV/VIS light source which radiates emission lines of different wavelengths. It is advantageous in this case if the various photoinitiators are so chosen and employed in such a concentration that a uniform optical absorption is produced in the case of the emission lines used.

As will be understood from the foregoing description and from the Examples, the specified amounts of components a) to d) refer to the total number of parts by weight of each of the defined component types. For example a mixture of 18 parts of an ethoxylated bisphenol A diacrylate and 18 parts of ethoxylated bisphenol A dimethacrylate constitute 36 parts in total and as such satisfy the definition for component C).

To the compositions of the invention there may be added small amounts (0 to 4 percent by weight, preferably 0 percent) of the diacrylate and dimethacrylate esters of aliphatic or cycloaliphatic diols. Examples of such diols are 1,3-butylene glycol, 1,4-butanediol, neopentyl glycol, 1,6-hexanediol, diethylene glycol, triethylene glycol, tetraethylene glycol, polyethylene glycol 400, polyethylene glycol 600, tripropylene glycol, ethoxylated or propoxylated neopentyl glycol, 1,4-dihydroxymethylcyclohexane, 2,2-bis-(4-hydroxycyclohexyl)-propane or bis-(4-hydroxycyclohexyl)-methane. However, it is preferred that the composition is free from di(meth)acrylate esters of aliphatic and cycloaliphatic diols.

If desired one may add customary additives to the compositions, for example stabilisers, e.g. UV stabilisers, polymerisation inhibitors, mould release agents, wetting agents, flow control agents, infra-red absorbers, sensitisers, anti-sedimentation agents, surface-active agents, dyes, pigments and fillers.

Compositions according to the invention can be prepared in a known manner, for example by premixing individual components and subsequently mixing these premixes or by mixing all the components by means of customary devices, such as stirred vessels, in the absence of light and, if appropriate, at a slightly elevated temperature.

Liquid compositions according to the invention can be polymerised by irradiation with actinic light, for example, by means of electron or X-ray beams or UV or VIS light, e.g. by means of radiation within the wavelength range from 280 to 650 nm. Laser radiation from HeCd, argon ions, or nitrogen ions and also metal vapour and NdYAG lasers of multiplied frequency are particularly suitable. It is known to those skilled in the art that a suitable photoinitiator must be selected and, if appropriate, sensitised for each light source selected.

The invention also relates to a process for polymerising liquid compositions according to the invention by irradiating them with actinic light.

Liquid compositions according to the invention preferably have a viscosity of 300 to 3000 mPa·s at 30° C., more preferably 400 to 1300 mPa·s and especially 500 to 1200 mPa·s. Compositions according to the invention have surprisingly low viscosity and this enables fast processing times in stereolithography. The low viscosity is achieved without adversely affecting physical or mechanical properties of articles produced.

The invention also relates to a process for the production of a three-dimensional solidified article from the liquid compositions according to the invention, preferably by stereolithography. Preferably this entails (a) the surface of a layer of the liquid composition according to the invention being irradiated either as the whole surface or in a predetermined pattern, by means of a UV/VIS (i.e. ultraviolet or visible) light source, such that a layer is solidified in a desired layer thickness in the irradiated areas; (b) then a new layer of a composition according to the invention is formed on the solidified layer, and this is also irradiated either as the whole surface or in a predetermined pattern; and (c) by repeating steps (a) and (b) a three-dimensional article composed of several solidified layers adhered to one another is obtained.

The number of times steps (a) and (b) are repeated depends on the thickness of the resultant solidified layers and the size of the article. Thus steps (a) and (b) could be repeated 10 times if each solidified layer was 1 mm deep and the article 1 cm high and 500 times if each solidified layer was 0.5 mm deep and the article 25 cm high. Preferably the solidified layers each independently have a depth of 0.1 to 1 mm, more preferably 0.2 to 0.6 mm, especially 0.25 to 0.4 mm. The solidified layers do not need to all be of the same depth. Repetition of steps (a) and (b) from 10 to 10,000, preferably 20 to 2000 times, forms one aspect of the invention.

The process for forming a three-dimensional article preferably uses a stereolithography apparatus, for example the SLA 250 or 500 supplied by 3D-Systems or the Stereos 300, 400 and 600 supplied by EOS.

There is no particular limit on what the three dimensional article can be, for example one may use the process to form ornamental and industrial articles and models of plant and animal parts. Industrial articles include mechanical parts, especially those used in automobiles, and models and prototypes thereof. Animal parts include bones, organs, tissues and combinations thereof. Examples of bones include joints (e.g. ball and socket joints such as the hip and shoulder, hinge joints such as the knee and elbow) the skull, jaw, spine, ribs, collarbone, shoulder blade, humerus, radius, ulna, teeth, finger and hand bones, breast bone, femur, tibia and fibula. Examples of organs include the liver, heart, lungs, kidneys, bladder, brain, eyes, intestines, pancreas and reproductive organs. Examples of tissue include muscle and cartilage.

As desired the three dimensional article can be a model which is the same size, smaller or larger than the original article. The low curl distortion and high rate of cure mean that such articles can be prepared quickly and accurately.

It is preferable to use a laser beam as the radiation source in this process.

Compositions according to the invention may also be used as coating agents; clear and hard coatings can be obtained on wood, paper, metal, ceramics or other surfaces. The coating thickness can be varied between wide limits, for example from 1 micrometer to 1 mm. Relief images for printed circuits or printing plates can be produced direct from compositions according to the invention by irradiating the mixtures, for example by means of a computer-controlled laser beam of suitable wavelength or using a photomask and a corresponding light source.

The curl factor is determined on test specimens produced by stereolithographic processes, the deformation of a self-supporting part of the test specimen being determined by shrinkage. The curl factor is the ratio of the height of a deformed, fixed segment of the test specimen to the height of the non-deformed segment.

The invention is further illustrated by the following examples in which all parts and percentages are by weight unless stated otherwise.

Viscosities were measured at 30° C. on a Brookfield viscometer RVTV-II using spindle 27 at 100 rpm.

The Tensile moduli, strength at break and elongation at break were measured using tensile testing bars prepared to ISO 527 and tested on an INSTRON 1122 fitted with a 1KN load cell.

Surface tension was measured using a torsion balance.

Linear shrinkage (L.S.) on cure was calculated by measuring the densities of the resins before and after curing. Linear shrinkage (%) was calculated by the equation:

$$L.S. = \left[1 - \sqrt[3]{\frac{\text{uncured density}}{\text{cured density}}}\right] \times 100\%$$

Processing parameters Ec and Dp mean respectively critial cure energy (mJcm$^{-2}$) and penetration depth (mils) and were measured using a 3D systems SLA250 stereolithography apparatus.

The rate of cure was measured using the Real Time Infra-Red technique described by A. K. Davies in Radiation Curing Polymers 2, special publication No 89, Royal Society of Chemistry, ISBN 0-85186-377-9.

The following abbreviations are used in the Examples:

SR-348: Ethoxylated bisphenol A dimethacrylate of MW 452, supplied by Sartomer.

SR-349: Ethoxylated bisphenol A diacrylate of MW 424 supplied by Sartomer.

SR-9035: $CH_3CH_2C-[CH_2O(CH_2CH_2O)_n COCH=CH_2]_3$ wherein n=5 of MW 956 supplied by Sartomer.

NR-2720: A urethane acrylate of formula $(H_2C=CHCO_2CH_2CH_2(OCOC_5H_{10})_n OCONH-C_6H_{10}-)_2-CH_2-$ wherein n=2 of MW 950 supplied by Zeneca Resins US.

DAR1173: U.V. Photoinitiator of formula Ph—CO—C(CH$_3$)$_2$OH.

IRG: Irgacure 651, a U.V. Photoinitiator from Ciba Geigy.

EB-270: Aliphatic urethane acrylate of MW approximately 1500 supplied by UCB Chemicals.

DC190: a silicone type surfactant supplied by Dow Corning Ltd.

EXAMPLES 1 TO 6

Liquid compositions according to the invention were prepared by stirring together at room temperature the number of parts by weight of components indicated in Table 1 below. After stirring for a few hours the homogenous mixtures were transferred into separate bottles for storage.

TABLE 1

| Example No. | SR-349 | SR-348 | NR-2720 | SR-9035 | DAR 1173 | DC190 | IRG |
|---|---|---|---|---|---|---|---|
| 1 | 8.0 | 42.0 | 34.5 | 10.0 | 5.5 | — | — |
| 2 | — | 45.0 | 34.5 | 15.0 | 5.5 | — | — |
| 3 | 8.0 | 42.0 | 34.5 | 10.0 | 5.5 | +0.2 | — |
| 4 | — | 45.0 | 34.5 | 15 | 5.5 | +0.2 | — |
| 5 | 20 | 35 | 29 | 10.5 | 5.5 | — | — |
| 6 | 20.5 | 35.9 | 29.8 | 10.8 | — | — | 3 |

For comparison commercially available liquid compositions were obtained from Ciba-Geigy (XB5143) and DuPont (SOMOS 3110).

Testing

The viscosity, tensile modulus, strength at break, elongation and surface tension of the exemplified compositions and the two commercially available resins XB5143 and SOMOS 3110 were measured as described above. The results are shown in Table 2 below:

TABLE 2

| Example No | Viscosity @ 30° C. mPa · s | Tensile Modulus MPa | Strength @ break MPa | elongation % | surface tension Dyne cm$^{-1}$ |
|---|---|---|---|---|---|
| 1 | 970 | 880 | 34 | 8 | 44 |
| 2 | 830 | 620 | 28 | 11 | 44 |
| 3 | 960 | 850 | 33 | 8 | 27 |
| 4 | 825 | 630 | 28 | 12 | 30 |
| 5 | 810 | 840 | 33 | 8 | 45 |
| 6 | 1100 | 953 | 44 | 8 | 44 |
| XB 5143* | 1900 | 600 | 24 | 8 | 40 |
| SOMOS 3110* | 735 | 960 | 43 | 9 | 41 |

*Comparative

The linear shrinkage on cure, shore hardness, Ec, Dp, rate of cure and curl factor were measured as described above. The results are shown in Table 3 below:

TABLE 3

| Example No | Linear shrinkage on cure % | Shore hardness "D" | $E_c$ mJ cm$^{-1}$ (He—Cd) | $D_p$ mils (He—Cd) | Rate of cure secs$^{-1}$ | Curl Factor |
|---|---|---|---|---|---|---|
| 1 | 1.93 | 74 | — | — | 60 | 10% |
| 2 | 1.88 | 70 | 6.1 | 5.1 | 53 | 8% |
| 3 | 1.95 | 75 | — | — | 58 | — |
| 4 | 1.90 | 70 | — | — | 54 | — |
| 5 | 1.77 | 75 | 5.8 | 4.9 | 53 | 10% |
| 6 | — | 75 | 7.5 | 6.2 | 55 | 10% |
| XB 5143* | 2.03 | 73 | 4.5 | 6.0 | 62 | 15% |
| SOMOS 3110* | 2.12 | 80 | 2.5 | 5.1 | 150 | 32% |

*Comparative

EXAMPLES 7 TO 19

Further liquid compositions may be prepared having the formulations given in Table 4 below:

TABLE 4

| Example No. | SR-349 | SR-348 | NR-2720 | SR-9035 | DAR 1173 | IRG | EB-270 |
|---|---|---|---|---|---|---|---|
| 7 | 15 | 46 | 24 | 9.5 | 5.5 | — | — |
| 8 | 10 | 40 | 25 | 19.5 | 5.5 | — | — |
| 9 | 19 | 44 | 21 | 11 | 5 | — | — |
| 10 | 4.5 | 40 | 40 | 10 | 5.5 | — | — |
| 11 | — | 42 | 42 | 10.5 | 5.5 | — | — |
| 12 | — | 49.9 | 30.2 | 14.4 | 5.6 | — | — |
| 13 | — | 45.5 | 34.5 | 15.0 | 5.0 | — | — |
| 14 | 55.0 | — | 29 | 10.5 | 5.5 | — | — |
| 1s | 55.0 | — | 29 | 10.5 | — | 5.5 | — |
| 16 | 56.6 | — | 29.8 | 10.8 | — | 2.8 | — |
| 17 | 20.5 | 35.9 | 29.8 | 10.8 | — | 3.0 | — |
| 18 | 10.9 | 36.6 | — | 12.5 | 5.5 | — | 34.5 |
| 19 | — | 50 | — | 19.5 | 5.5 | — | 25.0 |

We claim:

1. A liquid composition comprising:
   a) 2 to 20 parts of a monomeric poly(meth)acrylate having a (meth)acrylate functionality of at least 3 and a MW of at least 650;
   b) 20 to 60 parts of a urethane(meth)acrylate having a (meth)acrylate functionality of 2 to 4 and a MW of 400 to 10,000;
   c) 20 to 80 parts of a monomeric or oligomeric di(meth)acrylate made from bisphenol A or bisphenol F; and
   d) 0.1 to 10 parts of a photoinitiator;
   wherein all parts are by weight and the total number of parts of a)+b)+c)+d) add up to 100.

2. A liquid composition according to claim 1 wherein component a) has a MW in the range 880–1200.

3. A liquid composition according to claims 1 or 2 wherein component a) is present in an amount of 5 to 18 parts.

4. A liquid composition according to claims 1 or 2 wherein component b) is present in an amount of 20 to 50 parts.

5. A liquid composition according to claims 1 or 2 wherein component c) is present in an amount of 35 to 55 parts.

6. A liquid composition according to claims 1 or 2 wherein component d) is present in an amount of 2 to 8 parts.

7. A liquid composition according to claim 1 which comprises 8 to 16 parts of component a); 25 to 45 parts of component b); 40 to 50 parts of component c); and 3 to 7 parts of component d); wherein all parts are by weight and the total number of parts of a)+b)+c)+d) add up to 100.

8. A liquid composition according to claims 1, 2 or 7 wherein the monomeric or oligomeric di(meth)acrylate made from bisphenol A or bisphenol F is a mixture consisting of ethoxylated bisphenol A diacrylate and ethoxylated bisphenol A dimethacrylate.

9. A liquid composition according to claims 1, 2 or 7 having a viscosity of 300 to 3000 mPa•s at 30° C.

10. A process for the production of a three-dimensional solidified article wherein:
   (a) the surface of a layer of a liquid composition according to claims 1, 2 or 7 is irradiated either as a whole surface or in a predetermined pattern, by means of an ultraviolet or visible light source, such that a layer is solidified in a desired layer thickness in the irradiated areas;
   (b) then a new layer of the composition is formed on the solidified layer, and this is also irradiated either as a whole surface or in a predetermined pattern; and
   (c) by repeating steps (a) and (b), a three dimensional article composed of several solidified layers adhered to one another is obtained.

11. A three-dimensional solid article prepared by a process according to claim 10.

12. A liquid composition according to claim 1 which consists essentially of 8 to 16 parts of component a); 25 to 45 parts of component b); 40 to 50 parts of component c); and 3 to 7 parts of component d); wherein all parts are by weight and the total number of parts of a)+b)+c)+d) add up to 100.

* * * * *